United States Patent [19]

Gassmann et al.

[11] Patent Number: 5,115,214

[45] Date of Patent: May 19, 1992

[54] BALANCING LOOP

[75] Inventors: Felix Gassmann, Zürich; Ole Snedkerud, Windisch, both of Switzerland

[73] Assignee: Asea Brown Boveri Ltd., Baden, Switzerland

[21] Appl. No.: 595,406

[22] Filed: Oct. 11, 1990

[30] Foreign Application Priority Data

Nov. 9, 1989 [CH] Switzerland ............ 4048/89

[51] Int. Cl.⁵ .............................................. H01P 5/10
[52] U.S. Cl. .................................... 333/26; 343/859
[58] Field of Search ................. 333/25, 26; 343/859

[56] References Cited

U.S. PATENT DOCUMENTS

| | | |
|---|---|---|
| 2,187,014 | 1/1940 | Buschbeck et al. |
| 2,368,694 | 2/1945 | Watts |
| 2,646,505 | 7/1953 | Alford ........................ 333/26 X |
| 3,129,393 | 4/1964 | Coleman |
| 3,265,994 | 8/1966 | Bruene et al. ................ 333/26 X |

FOREIGN PATENT DOCUMENTS 724131 8/1942 Fed. Rep. of Germany.

OTHER PUBLICATIONS

"Taschenbuch Der Hochfrequenztechnik; Auflage 2", 1962, Springer-Verlage, Berlin, see p. 382, Line 10-p. 387, Line 28; FIG. 18.11.
Taschenbuch Der Hochfrequenztechnik (Manual of Radio-frequency Engineering, 3rd edition, Sprin-ger-Verlag, (1968), p. 394 (FIG. 18.11), H. Meinke and F. W. Gundlach.
Brown Boveri Mitt., Issue 2/3, 1972, pp. 97 to 103, Ein Neuer 250-KW-Kurzwellensender.

*Primary Examiner*—Paul Gensler
*Attorney, Agent, or Firm*—Oblon, Spivak, McClelland, Maier & Neustadt

[57] ABSTRACT

A balancing loop including a housing inside of which is disposed a first conductor part having a first sublength and a second sublength, with the first sublength constructed as a coaxial line passing through the housing and having its inner conductor terminated inside the housing and connected to a second conductor part, and the second sublength extending from the termination of the inner conductor to the second conductor part to an output line. The second conductor part also has the first and second sublengths and extends spaced apart from and parallel to the first conductor part. The second conductor part has one side connected to the housing and the other side to another output line. The output lines connected to the first and second conductor parts thereby form two symmetrical output lines which lead out of the housing. At least one variable capacitor is arranged between the first and second conductor parts to tune the balancing loop over the operating frequency range. The characteristic line impedance of the first and second conductor parts and the first sublength are chosen such that the balancing loop can be tuned to a different frequency only by means of the variable capacitor, and without the need for changing the electrical length of the first sublength.

11 Claims, 6 Drawing Sheets

BALANCING LOOP

BACKGROUND OF THE INVENTION

1. Field of the Invention

The present invention relates to the sphere of radio-frequency engineering. In particular, it concerns a balancing loop known, e.g. from H. Meinke and F. W. Gundlach, Taschenbuch der Hochfrequenztechnik (Manual of Radio-frequency Engineering), 3rd edition, Springer-Verlag, (1968), page 394 (FIG. 18.11).

DISCUSSION OF BACKGROUND

In the technology of broadcasting transmitters, use is made of so-called balancing loops or baluns (Balancing Units) having a coaxial input and a symmetrical output, in order, for example, to be able to supply balanced-to-ground antennas via a coaxial feeder.

A possible implementation of such a balun (FIG. 1) consists of two parallel coaxial lines 18 and 19, which are interconnected in the manner represented. In order to tune to different frequencies in the desired frequency range of approximately 4 MHz to 26 MHz, a variable capacitor C is provided at the input, and a shorting plunger 20 is provided at the output-side end of the second line 19.

This type of balun has the disadvantage that a large voltage asymmetry (resonance) results for an asymmetrical load of only a few pF. This sensitivity to asymmetries cannot be removed by a simple modification.

An impedance transformation is frequently associated with the rebalancing in the balun: in the case of the solution represented in FIG. 1, an unbalanced input impedance of 50 Ω is increased in the ratio 1:4 to a symmetrical 200 Ω.

In order to be able to achieve higher transformation ratios (e.g. 1:6, i.e. from 50 Ω to 300 Ω), it is then necessary to connect downstream an additional transformer of the line type with a length of approximately 12 m, which is difficult to produce and—above all at lower frequencies—has relatively large impedance fluctuations.

It would now be conceivable to modify the type of balun mentioned at the beginning, which cannot be matched to different frequencies, in such a way that it can be used for a larger frequency range. As represented in FIG. 2, such a modification could comprise an input-side shorting plunger 21 and an output-side variable capacitor C1.

The disadvantage of such a balun would reside in the need to adjust two parameters given a change in frequency. Furthermore, plungers lead with their contacts to problems such as wear, bending of the contacts and instances of burning.

SUMMARY OF THE INVENTION

Accordingly, one object of this invention is to provide a novel balancing loop which, at least in the frequency range 4 MHz to 26 MHz, allows a transformation ratio greater than 1:4, can be easily tuned, and is typified by a rugged construction.

In the case of a balancing loop of the type mentioned at the beginning, the object is achieved when on the second sublength at least one capacitor is arranged between the first and second conductor part; and the first sublength is chosen such that the balancing loop can be tuned to different frequencies by means of the at least one capacitor alone.

The invention is based on the realization that with a balun of the type represented in FIG. 2, the parameters (line impedances and line lengths) can be chosen such that a variable capacitor at the symmetrical output is sufficient for tuning to different frequencies.

It is possible in this way to implement a rugged and compact balun which at the same time can be very easily tuned.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
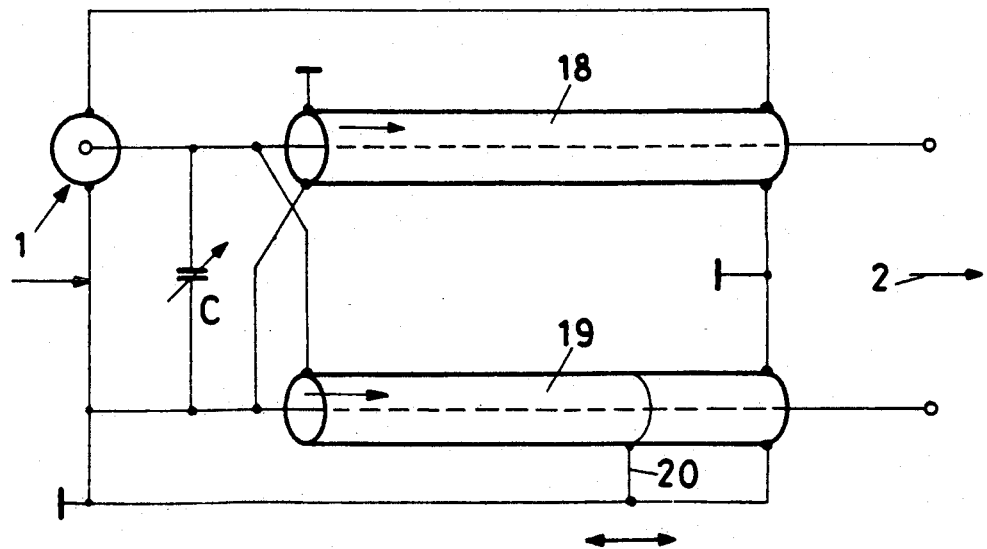
FIG. 1 shows the basic circuit diagram of a tunable balun according to the prior art.

Referring now to the drawings, wherein like reference numerals designate identical or corresponding parts throughout the several views, FIG. 1 shows a known balancing loop (balun), such as is employed in shortwave transmitters, and such as is represented in a similar form, e.g. in the printed publication Brown Boveri Mitt., Issue Feb. 3, 1972, pages 97 to 103.

The known balun has a coaxial input 1 and a symmetrical output 2, between which two coaxial lines 18 and 19 are connected in parallel. This balun is tuned by a variable capacitor C located at the input and a shorting jumper 20, with which the effective length of the second line 19 can be varied.

It is disadvantageous here, on the one hand, that this form of balun is limited to a transformation ratio of 1:4. On the other hand, given a change in frequency it is necessary for two parameters (capacitance of C and effective length of the second line 19) to be varied.

Figure 2:
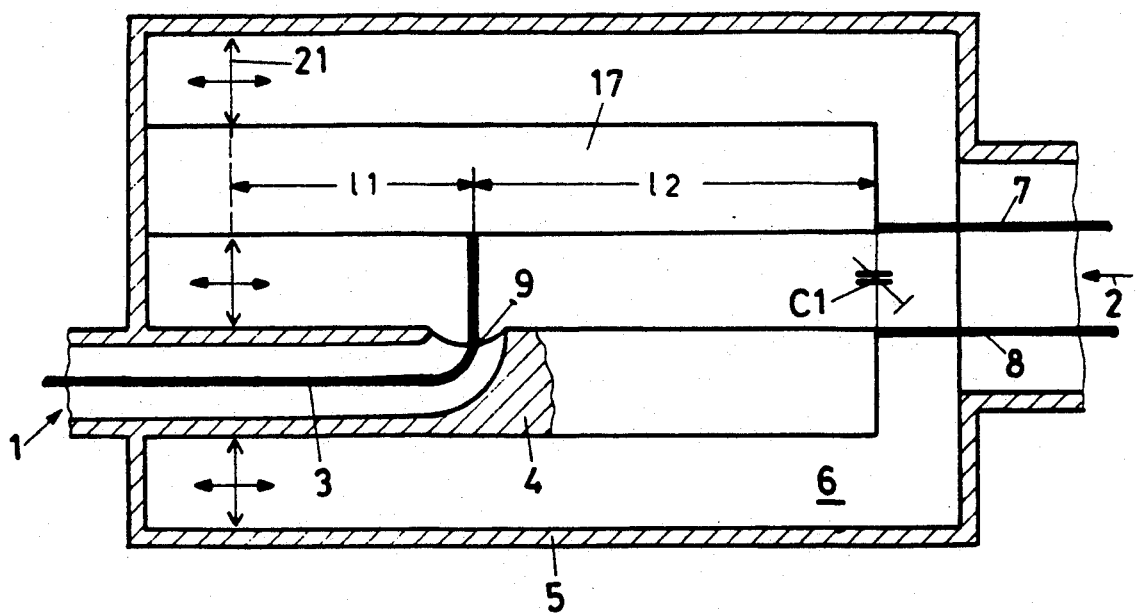
FIG. 2 shows the possible construction of another tunable balun.

A possible solution for higher transformation ratios, which is based on the type of balun shown in the book by Meinke and Gundlach, is reproduced in FIG. 2. Two conductor parts 4 and 17 of the same length are arranged in parallel in the interior 6 of a housing 5 in such a way that they are conductively connected in each case with their one end to the housing 5 and end freely in the interior 6 on the other side.

The first conductor part 4 is constructed on a first sublength 11 as a coaxial line with a coaxial inner conductor 3. This coaxial line ends on the one side in the coaxial input 1. On the other side, the inner conductor 3 emerges at a right angle through an opening 9 from the first conductor part 4, runs to the opposite second conductor part 17, and is connected conductively thereto.

Two conductor parts 4, 17 are similar on a second sublength 12.

A symmetrical output line 8 and 7, respectively, is connected in each case to the free ends of the conductor parts 4 and 17. Two symmetrical output lines 7, 8 together form the symmetrical output 2.

Two elements are provided for tuning the balun in accordance with FIG. 2: firstly, a first sublength 11 can be varied by means of a shorting plunger 21. Secondly, the free ends of the conductor parts 4, 17 are interconnected via a variable capacitor C1.

Although this balun allows transformation ratios greater than 1:4, because of the two elements C1 and 21 it can be tuned only with difficulty, and due to the mechanical shorting plunger 21 is susceptible to faults.

It has now been established in computing the different parameters of a balun in accordance with FIG. 2 as a function of frequency that given a suitable choice of these parameters (characteristic line impedance $Z_0$, first and second sublengths 11 or 12), the balun can be tuned over a frequency range from 4 to 26 MHz, without the first sublength 11 needing to be changed substantially or at all. Consequently, there is no need for the shorting plunger 21; the balun can be tuned to the frequency with the aid of the variable capacitor C1 alone.

Thus, there is at least one value of 11 for which 11 can be held constant over the entire frequency range. If deviations in the VSWR are allowed, there is even a multiplicity of 11 values that remain constant.

An input impedance of 50 Ω is assumed in the following example. In general, however, an arbitrary impedance can be chosen at the input.

| Example: | |
|---|---|
| Input impedance: | 50 Ω |
| Output impedance: | 300 Ω |
| 11 + 12: | 2.704 m |
| 11: | 1.104 m |
| Characteristic line impedance $Z_0$: | 111 Ω | where the characteristic line impedance $Z_0$ refers to the line including conductive parts 4 and 17 and the surrounding housing 5, and is the characteristic impedance of the shielded line sections 11 and 12 (4 and 17) to ground.

If the parameters are chosen in the manner specified in the example, a virtually ideal tuning of the balun is achieved, if the capacitance of the capacitor C1 is varied from 1571 pF at 4 MHz to 25.1 pF at 26 MHz.

Figure 3:
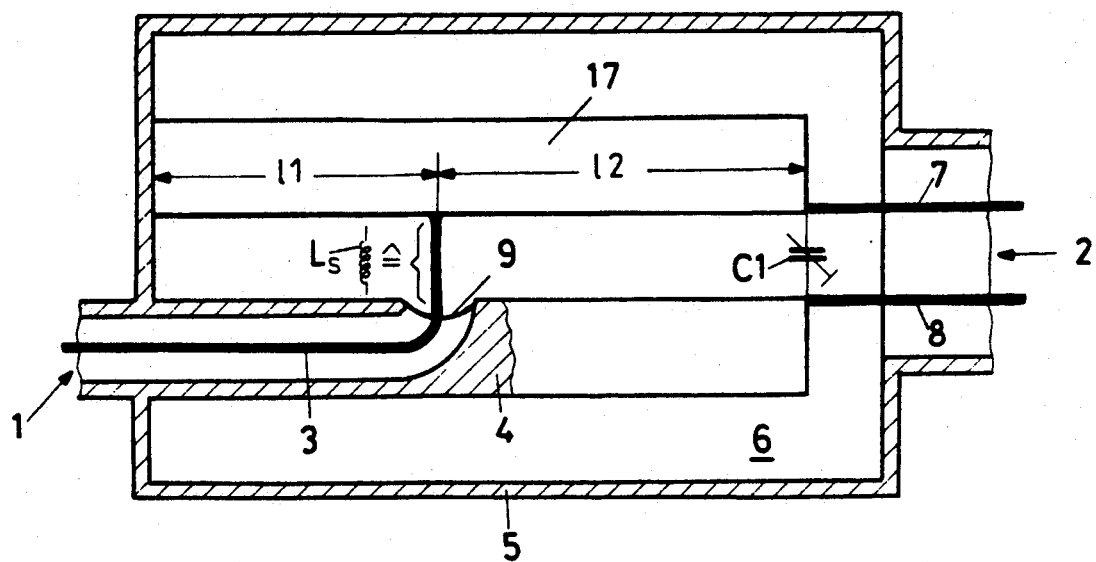
FIGS. 3–8 show different embodiments for a balun according to the invention, which differ from one another due to difference configuration of the center tap.

In its simplest embodiment, such a balun then has the configuration represented in FIG. 3. It is compact, requires no additional line transformer (from 200 to 300 Ω) for a (1:6) transformation, and can be tuned with only one relatively small capacitor.

The simple embodiment in accordance with FIG. 3 can, however, be further improved for the following reasons:

1. Given an ideal 300 Ω load, the SWR at the 50 Ω input is greater than 1.35 for the lowest and highest operating frequency, in each case. Consequently, in this form the balun is only conditionally suitable for use with a power of more than 50 kW.

2. Although the voltage symmetry at low frequencies (35% lower than the maximum operating frequency) and for an asymmetrical load really is better than in the case of the (1:4) balun according to FIG. 1, the symmetry deteriorates exponentially in the vicinity of the highest operating frequency. The voltage asymmetry can then, depending upon load, be up to 1:10 at the output of the balun.

The causes of these problems reside in edge effects, which are caused by the prescribed design construction:

1. A first interference factor is the leakage inductance $L_S$, which results from the center tap in the balun (illustrated diagrammatically in FIG. 3). This leakage inductance $L_S$ chiefly worsens the SWR, and also has an effect on the symmetry sensitivity.

2. The sensitivity of the balun to asymmetrical load depends essentially upon the choice of the minimum adjustable capacitance and upon the associated highest operating frequency.

Figure 4:
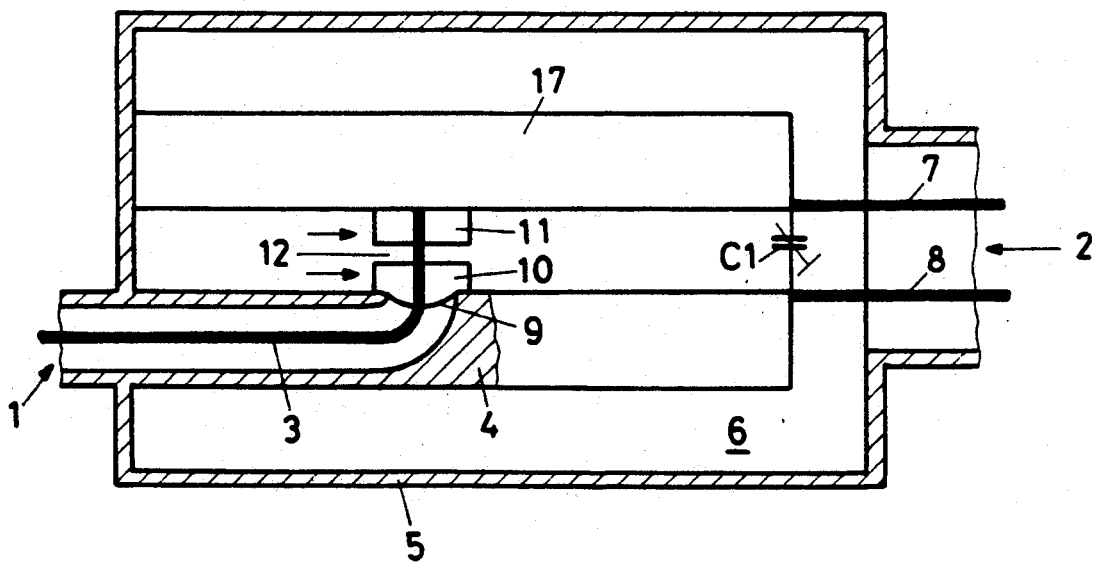

The first effect (leakage inductance) can be removed by the development, represented in FIG. 4 of the balun of FIG. 3: the center tap is "covered" symmetrically from both sides by two tube lengths 10 and 11, and a slot 12 is left open in the middle in this process depending upon the desired disruptive strength. In conjunction with the coaxial inner conductor 3 of the center tap, the tube lengths 10 and 11 then form in each case a coaxial line with 50 Ω (in accordance with the example) or a different line impedance.

Figure 5:
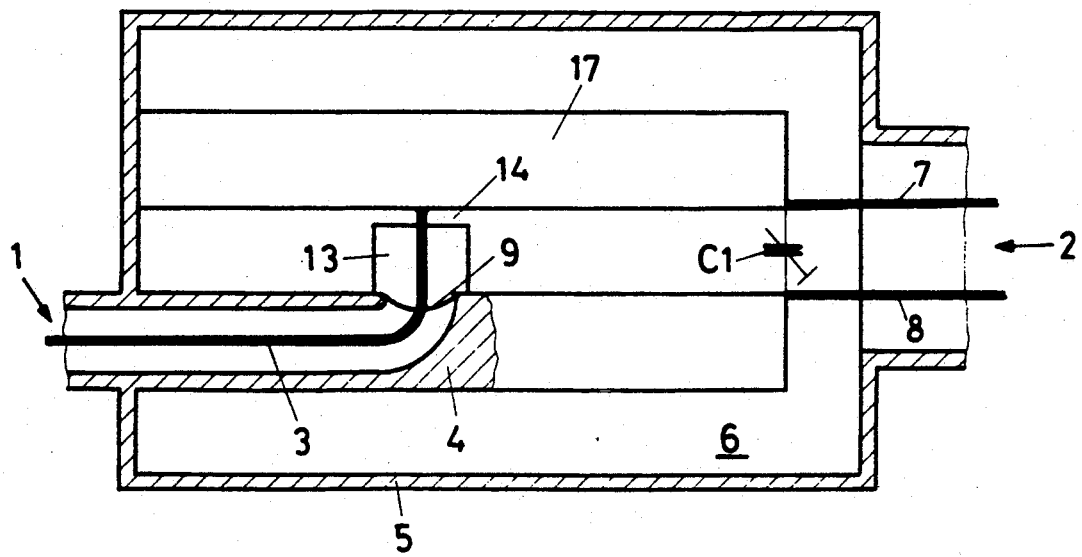
Figure 6:
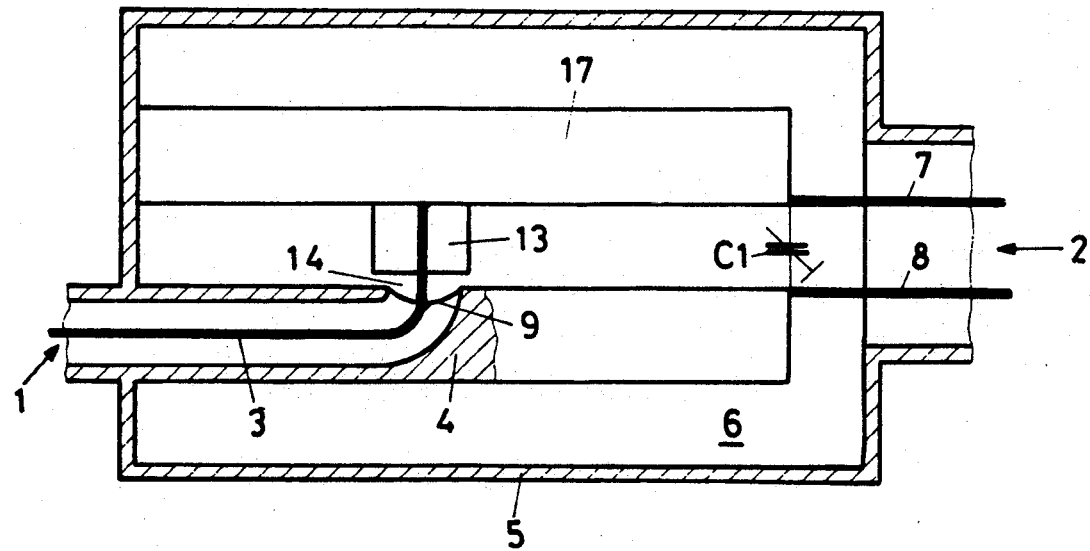

Furthermore, there is also the possibility of fitting a tube length 13 from only one side in each case, which tube length is separated from the other side by a slot 14 (FIGS. 5 and 6). The slot opening is determined in this arrangement by the disruptive strength.

Figure 7:
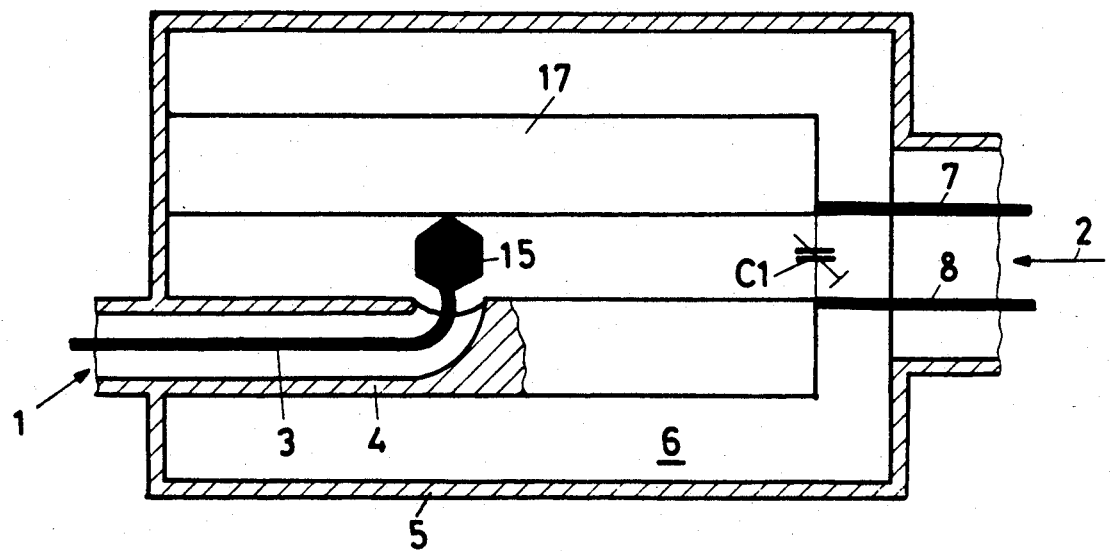
Figure 8:
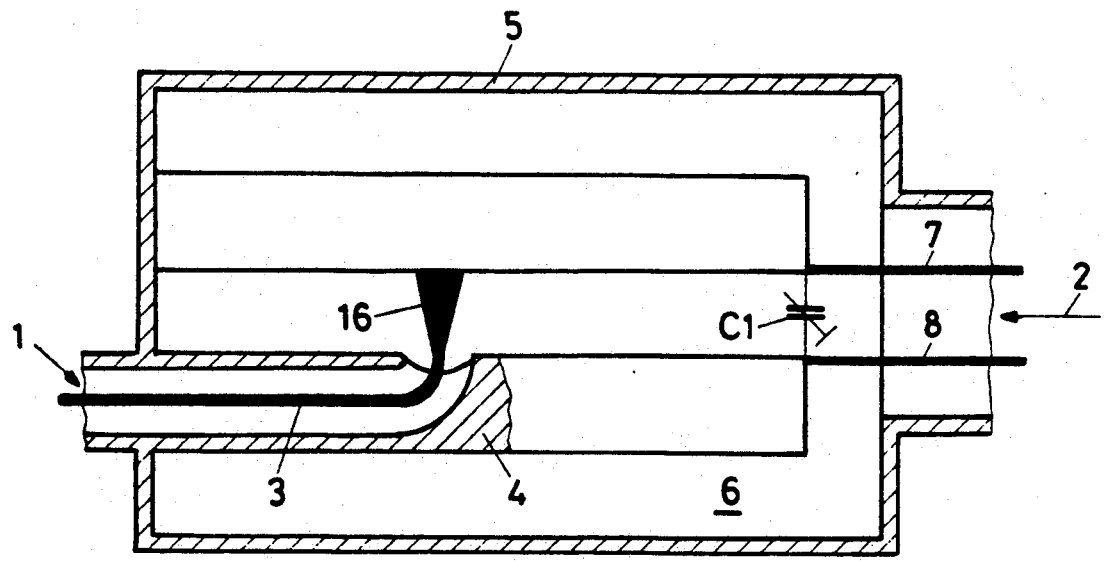

Other variants for reducing the leakage inductance are shown by FIGS. 7 and 8. Here, the outer diameter of the top (of the coaxial inner conductor 3 in the gap between the conductor parts 4 and 17) is increased in the form of widened portions 15 or 16, and the inductance is thereby reduced. Care must be taken in this regard that the widened portions 15, 16 are not provided inside the 50Ω coaxial line present in the first conductor part 4. This is the reason for the chosen double conical (FIG. 7) or simple conical (FIG. 8) shape.

Figure 9:
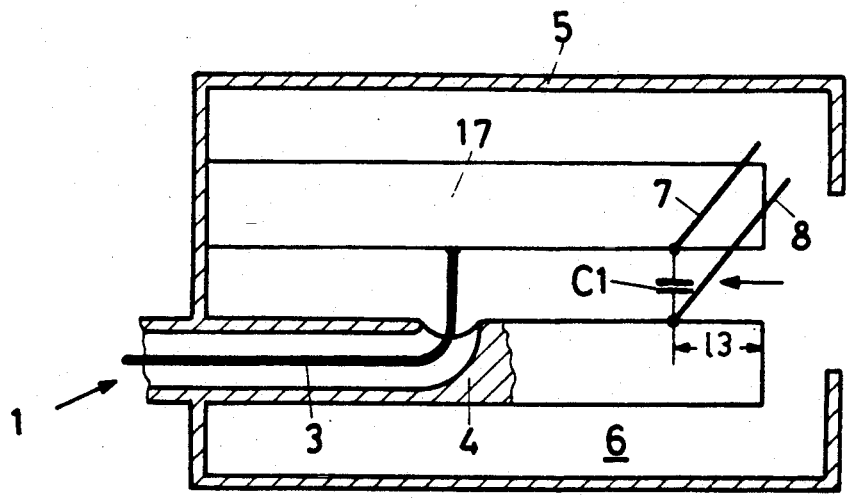
FIGS. 9–9B show further illustrative embodiments for a balun according to the invention, in which balun the capacitor connecting points are displaced.
Figure 9A:
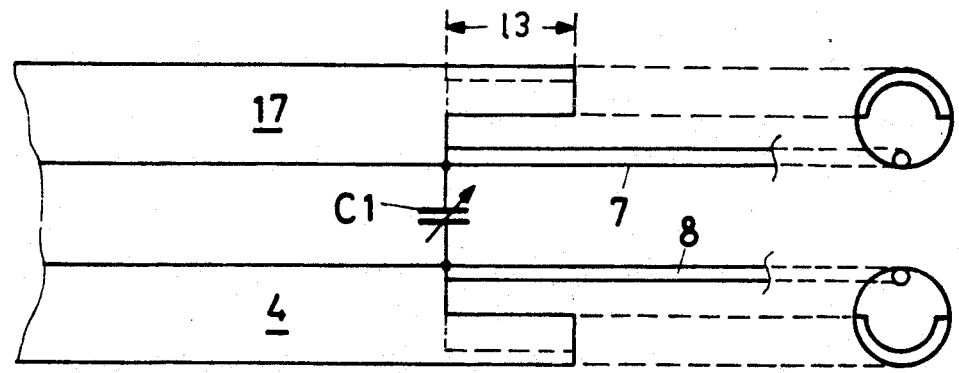
Figure 9B:
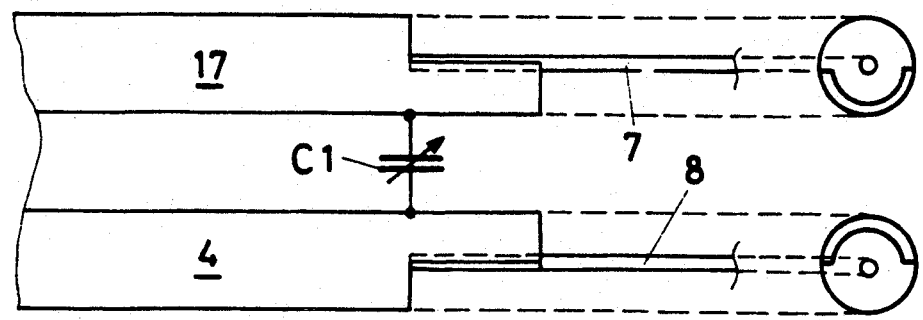

A further possibility for compensating the leakage inductance $L_S$ is to displace the capacitor C1 by one sublength 13 (approx. 20 cm per 100 nH leakage inductance) in the direction of the center tap (FIG. 9). The tapping for the symmetrical output 2 by means of the symmetrical output lines 7, 8 would then also have to be done directly via the capacitor C1. Two illustrative embodiments for such a tapping, which are mechanically simple to produce, are reproduced in FIGS. 9A and B.

The second effect (sensitivity to asymmetrical load) can be reduced when the following condition is fulfilled for the minimum adjustable capacitance $C_{min}$ of the capacitor C1:

$$C_{min}/C_{asym} > 4,$$

wherein $C_{asym}$ denotes the maximum occurring asymmetry at the output and is the maximum occurring stray capacitance difference at the symmetrical output liens of an asymmetrical load at the output of the balancing loop.

Further illustrative embodiments follow (FIGS. 10A–C), when the individual capacitor C1 is replaced by a multiplicity of capacitors C1 ... C8.

Figure 10A:
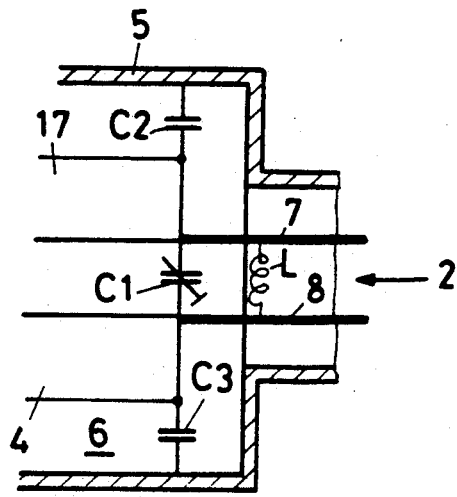
FIGS. 10A–C show illustrative embodiments for a balun according to the invention, in which embodiments a plurality of capacitors or one additional inductor are employed.

In addition to the variable capacitor C1, two further capacitors C2, C3 (variable or not), which are connected in each case between a conductor part and housing 5, are provided in FIG. 10A between the conductor parts 4 and 17.

Figure 10B:
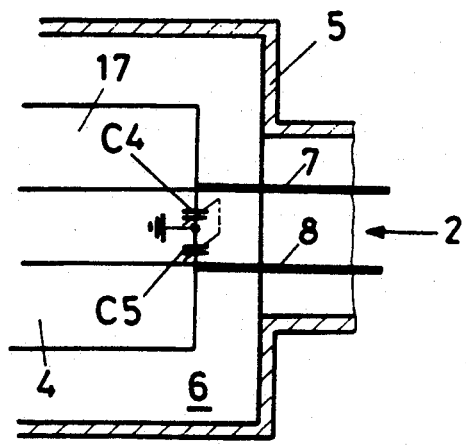

Two variable capacitors C4, C5 are connected in series and grounded with the midpoint between the conductor parts 4, 17 in FIG. 10B. This solution entails various advantages such as, for example, a better immunity against asymmetries on the transmission line.

Figure 10C:
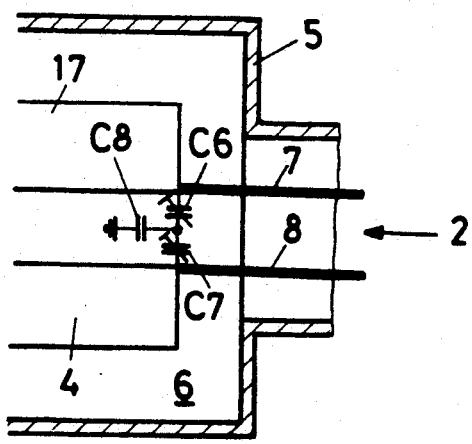

The midpoint grounding of FIG. 10B can, however, also be done via a further capacitor C8 (FIG. 10C).

In all cases, the frequency range of the balun can be increased by inserting an additional inductor L into the symmetrical output—as represented in the example of FIG. 10A. In this way, the compensation can be extended to higher frequency ranges for which the capacitance C of the capacitor C1 would need to be less than $C_{min}$.

Obviously, numerous modifications and variations of the present invention are possible in the light of the above teaching. It is therefore to be understood that within the scope of the appended claims, the invention may be practiced otherwise than as specifically described herein.

What is claimed as new and desired to be secured by Letters Patent of the United States is:

1. A balancing loop comprising:
   a housing having an interior;
   inside the housing, a first conductor part having a first and second sublength, the first sublength of the first conductor part constructed as a coaxial line with a coaxial inner conductor, which passes through the housing on the one side as a coaxial line and forms a coaxial input there, and ends freely on the other side inside the housing;
   inside the housing, a second conductor part having the same overall length as said first conductor part and including corresponding first and second sublengths, wherein the first sublength of said second conductor part extends spaced from and parallel to the first sublength of the first conductor part and is connected on the one side of the coaxial input to the housing, and the second sublength of said second conductor part ends freely on the other side inside the housing;
   in the first conductor part, an opening at the end of the first sublength, through which the coaxial inner conductor emerges at a right angle from the first conductor part and is connected to the second conductor part at an interface between the first and second sublengths of said second conductor part;
   two symmetrical output liens which are connected on the second sublengths in each case to one of the conductor parts, lead out of the housing, and form a symmetrical output there; and
   at least one variable capacitor connected between the second sublengths of the first and second conductor parts;
   wherein a characteristic lien impedance of the line made up of the first and second conductor parts within the housing and the first sublength of the first and second conductor parts are chosen such that the balancing loop can be tuned to different frequencies by means of only the at least one capacitor, without need for changing the electrical length of the first sublength;
   wherein the minimum capacitance $C_{min}$ of said at least one capacitor is chosen such that
   $C_{min}C_{asym} > b$,
   wherein $C_{asym}$ is the maximum occurring stray capacitance difference at said symmetrical output lines of an asymmetrical load at the output of said balancing loop.

2. The balancing loop as claimed in claim 1, wherein in order to reduce the leakage inductance, the coaxial inner conductor between the first and second conductor parts is surrounded by at least one tube length, which is connected to one of the conductor parts and, together with the coaxial inner conductors, forms a coaxial line.

3. The balancing loop as claimed in claim 2, wherein two tube lengths are provided which are each connected to one of the conductor parts and are separated from one another by a slot.

4. The balancing loop as claimed in claim 2, wherein only one tube length is provided, which is connected to one of the conductor parts and is separated from the other conductor part by a slot.

5. The balancing loop as claimed in claim 1 wherein in order to reduce the leakage inductance the coaxial inner conductor has a widening between the two conductor parts.

6. The balancing loop as claimed in claim 5, wherein the widening is conical.

7. The balancing loop as claimed in claim 1 wherein in order to reduce the leakage inductance, the at least one capacitor connects the two conductor parts at a point that is removed from the free ends of the conductor parts by a third sublength.

8. The balancing loop as claimed in claim 1 wherein two capacitors are connected in series between the first and second conductor parts and grounded in the middle.

9. The balancing loop as claimed in claim 8, wherein the grounding is done via a further capacitor.

10. The balancing loop as claimed in claim 1, wherein the free ends of the conductor parts are connected to the housing via respective further capacitors.

11. The balancing loop as claimed in claim 1, wherein in order to expand the frequency range an additional inductor is connected between the symmetrical output lines.

* * * * *